United States Patent [19]
Sturans et al.

[11] Patent Number: 6,028,662
[45] Date of Patent: Feb. 22, 2000

[54] ADJUSTMENT OF PARTICLE BEAM LANDING ANGLE

[75] Inventors: Maris A. Sturans, Wappingers Falls, N.Y.; Rodney A. Kendall, Ridgefield, Conn.

[73] Assignee: International Business Machines Corporation, Armonk, N.Y.

[21] Appl. No.: 09/320,534

[22] Filed: May 26, 1999

[51] Int. Cl.[7] .............................. G01J 1/00; G01B 11/26
[52] U.S. Cl. .................... 356/123; 356/138; 250/396 R; 250/310
[58] Field of Search ........................... 356/123, 399–400, 356/121, 122, 138, 153; 250/30 G, 310, 396 R, 396 ML; 324/751

[56] References Cited

U.S. PATENT DOCUMENTS 4,472,055   9/1984   Tsutsumi ................................ 356/123
5,606,261   2/1997   Golladay ................................ 250/310

Primary Examiner—Hoa Q. Pham

[57] ABSTRACT

The invention relates to a method and apparatus for measuring The landing angle of a particle beam is adjusted by scanning the beam over two cylindrical beam target surfaces that are positioned close to the system axis. The output of a beam detector is differentiated and displayed on an oscilloscope. The relevant lens current is adjusted until one side of the scan indicates that the focal plane of the beam is at the center of the beam target. The angle of the beam is then adjusted with the relevant deflector until both sides of the scan are the same, indicating that the beam is accurately vertical.

10 Claims, 8 Drawing Sheets

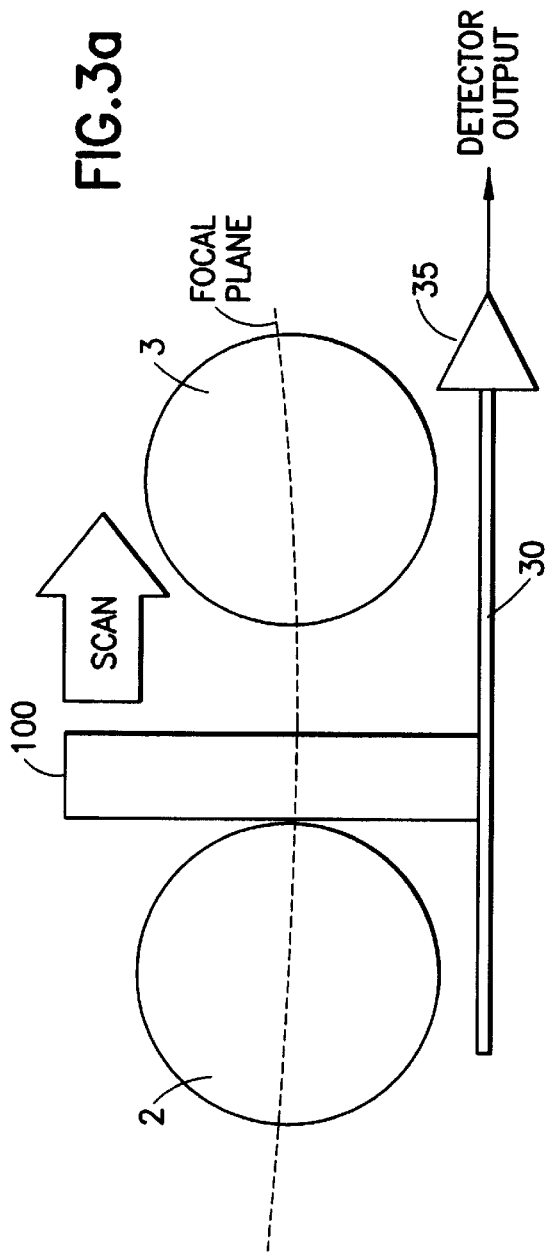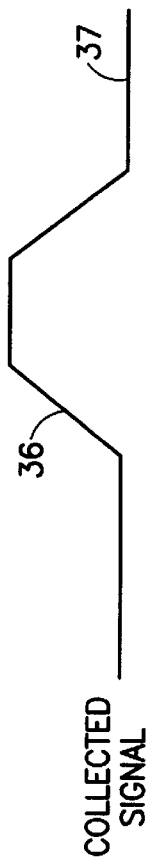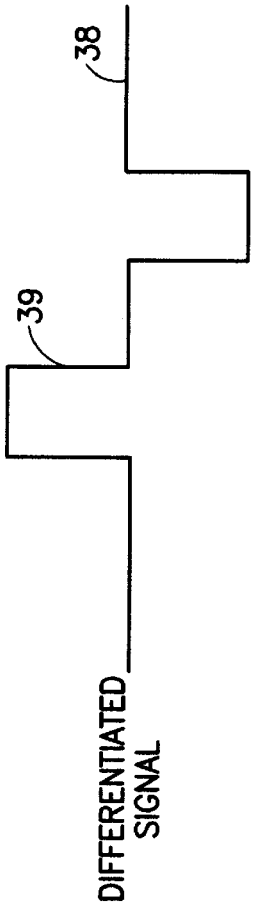

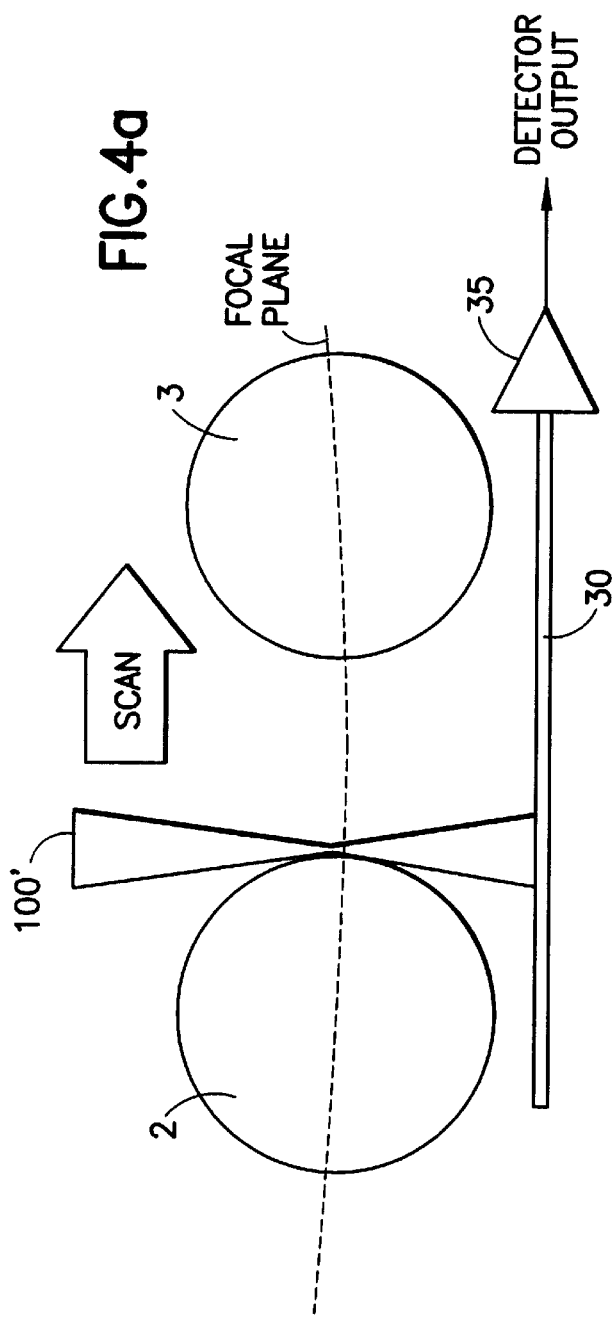

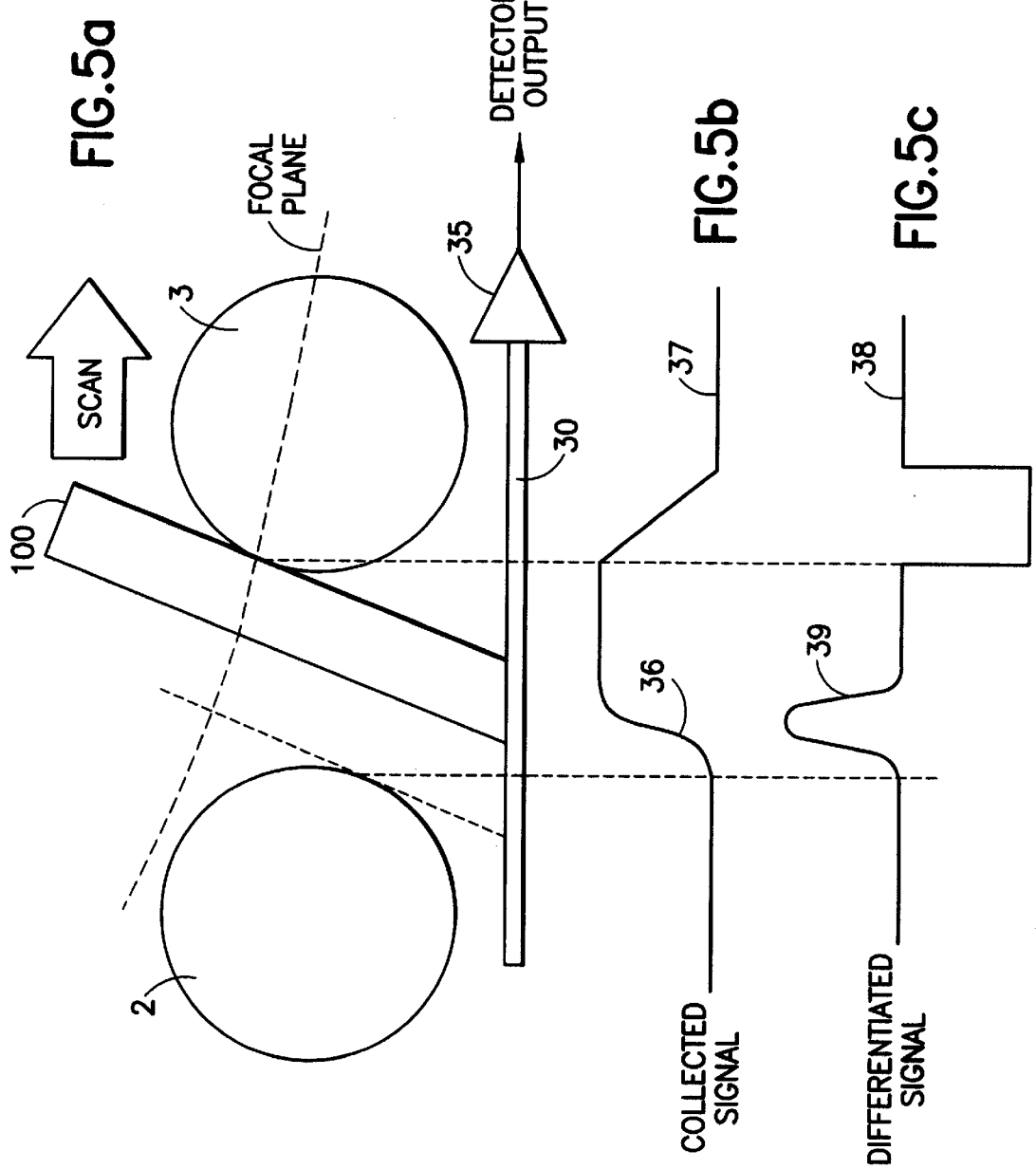

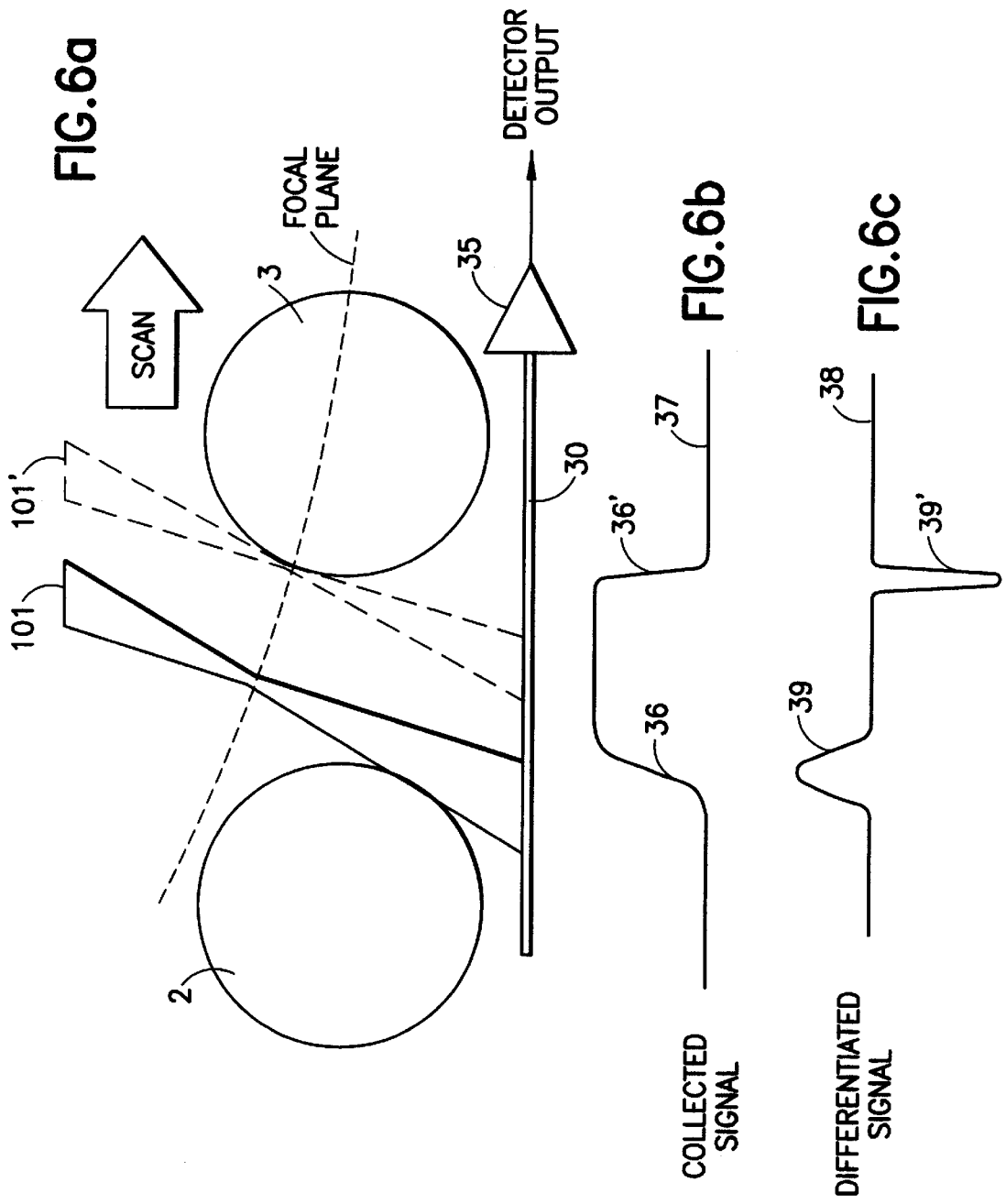

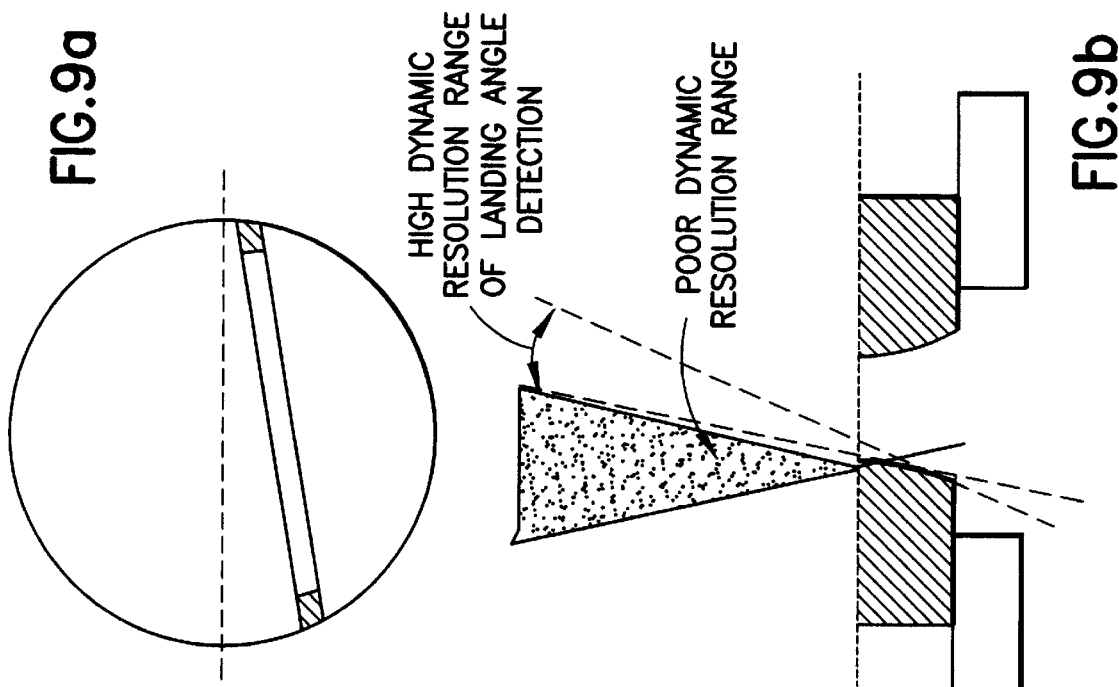
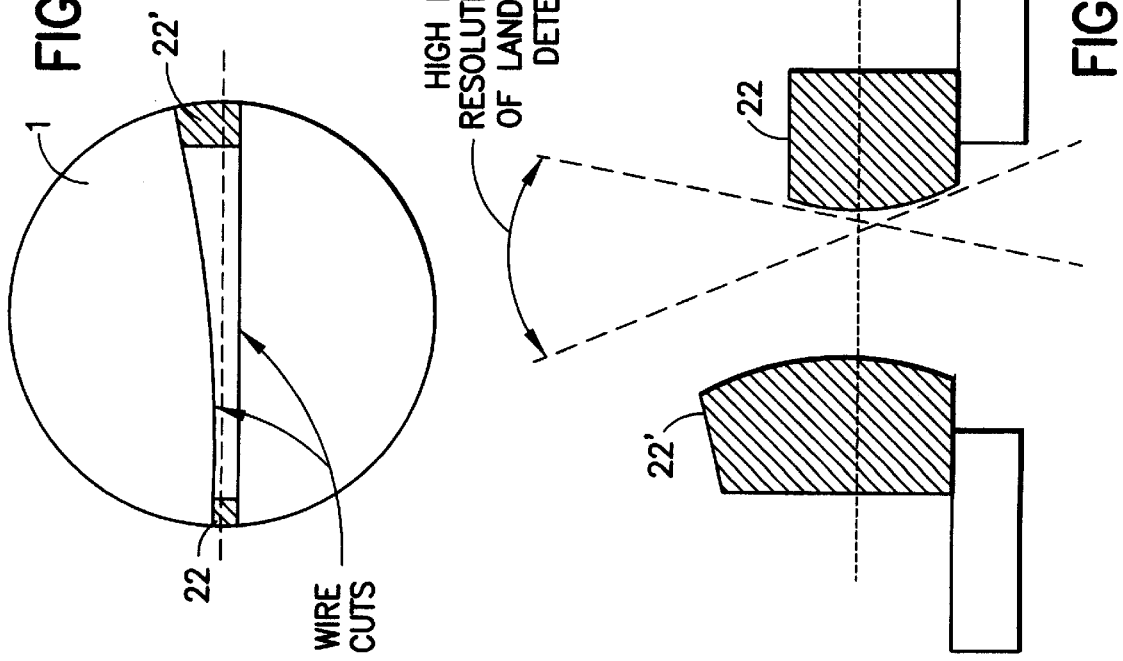

ADJUSTMENT OF PARTICLE BEAM LANDING ANGLE

FIELD OF THE INVENTION

The field of the invention is lithography with particle beam systems.

BACKGROUND OF THE INVENTION

As the critical dimensions of integrated circuits become smaller, it becomes more important that the landing angle of the beam be held within specifications (90°±δ). At present, it is desirable to have a tolerance on the landing angle of ±0.5 milliradians.

For a height variation in the wafer, reticle or other workpiece of ±5 μm, a landing angle error of 0.5 mr will shift the beam spot by ±5 nm.

The prior art has been compelled to use a lengthy and tedious method of repetitively writing registration marks as a function of wafer angle and measuring the wafers on an optical metrology tool such as a Leica 2020 in order to measure the landing angle of a particle beam with great accuracy. Short hand methods such as the use of two apertures are known, but this method requires that the apertures be aligned with an error of less than 2 nm in order to be useful.

SUMMARY OF THE INVENTION

The invention relates to a method and apparatus for measuring landing angle in which two cylindrical beam target surfaces are positioned close to the system axis and the beam is scanned over the left and right surfaces. The output of a beam detector is differentiated and displayed on an oscilloscope. The relevant lens current is adjusted until one side of the scan indicates that the focal plane of the beam is at the center of the beam target. The angle of the beam is then adjusted with the relevant deflector until both sides of the scan are the same, indicating that the beam is accurately vertical. In a preferred embodiment, visual inspection permits the rapid adjustment of the lens and deflector, but the method can be practiced with computer analysis of the detector output signals.

BRIEF DESCRIPTION OF THE DRAWINGS

FIGS. 3a–3c to 6a–6c illustrate different beam configurations and the associated signals.

FIGS. 8a–9b illustrate the effect of manufacturing errors on the measurement range.

DESCRIPTION OF THE PREFERRED EMBODIMENT

Figure 1:
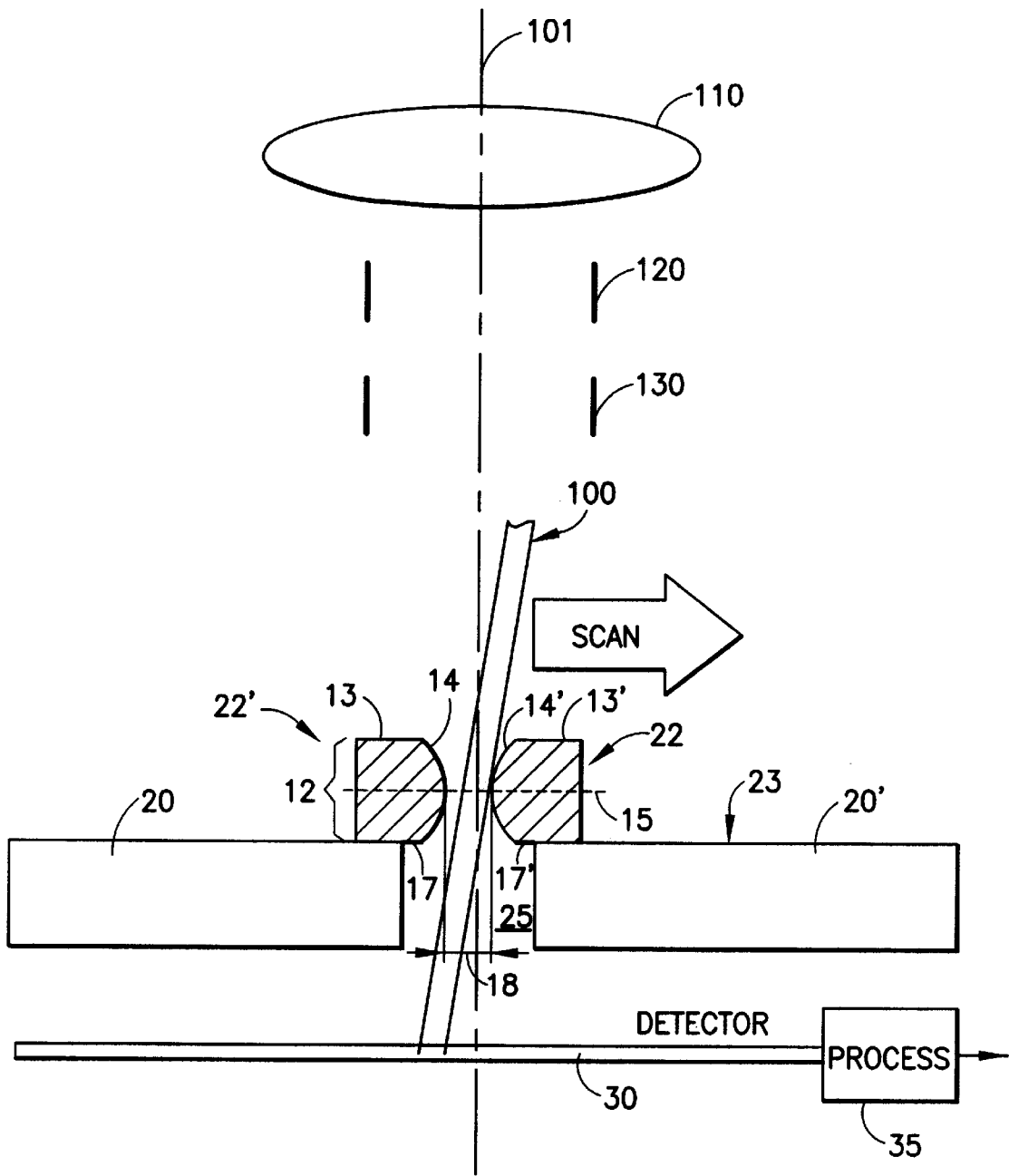
FIG. 1 illustrates a portion of an e-beam system including the invention.

Referring now to FIG. 3, there is shown a prior art method of beam edge slope detection, in which wires 2 and 3, illustratively 0.5 mm in diameter, are positioned upstream of a current detector. The beam is scanned from left to right at a convenient repetition rate (60 Hz) to give a stable trace and the output of the beam striking detector 30, differentiated and amplified in processor 35, is displayed on an oscilloscope 38.

In the illustrated case of a beam from a shaped beam system, having uniform current density, the signal from detector 30 is shown in FIG. 3b and the differentiated trace is shown in FIG. 3c. Since the beam current density is uniform, the slope in FIG. 3b is constant and the trace edges in FIG. 3c are sharp. This indicates that the beam is normal to the detector, as is explained with respect to FIG. 5. In FIG. 4, similar results are shown for a beam having a Gaussian intensity distribution. In this case, the beam intensity does not jump to its full value and the trace edges are not as sharp as their counterparts in FIG. 3.

FIG. 5 shows the case in which the apparatus of FIG. 1 is used to measure the landing angle of the beam. Uniform beam 100 from FIG. 3 is now at a finite angle with respect to the normal to detector 30. The magnitude of the angle is exaggerated for clarity and practical systems need only measure deviations of about 0.5 mr. In this case, the current in the relevant lens is adjusted to move the focus upstream until one of the differentiated traces is sharp, indicating that the beam focal plane intersects that wire (in this case, wire 3). The corresponding traces in FIGS. 5b and 5c correspond to those in FIG. 3, but the left traces are different and less sharp because the beam is out of focus when it intersects the left wire 2. In that case, the current trace at 36 is not uniform and the differentiated signal at 39 has a noticeable slope. The traces in FIGS. 6a to 6c show a similar effect in the case of a Gaussian beam. The traces on the right side of FIGS. 5c and 6c will be referred to as having a characteristic shape, meaning that the edges of the peaks are at their sharpest and therefore characteristic of having the focal plane intersecting the beam target member. The slope of actual traces will depend on the intensity distribution of the beam. As will be explained below, this prior art apparatus is not sufficiently sensitive to be practical as an indicator of landing angle.

Referring now to FIG. 1, there is shown a portion of a simplified particle beam system employing the present invention. Here, lens 110 is the relevant lens that will be used to adjust the position of the beam focal plane and deflectors 120 and 130 will be used, as is known in the art, to adjust the landing angle of the beam. In modern systems, the landing angle adjustment will be made upstream of the final focus lens, both for convenience and because of space limitations, but that is not relevant to the explanation of the present invention. The two beam target members 22 and 22' will be discussed below. Initially, the current in lens 110 is used to adjust the focal plane until a trace similar to that in FIG. 5 is found. It does not matter which side has the sharp trace.

Then, the deflectors 120 and 130 are adjusted, as is known in the art, to shift the beam so that the trace of FIG. 3 is achieved. At this time, the beam is parallel to system axis 101, to which surface 23 (and plane 15) has been aligned perpendicular. Preferably, surface 23 is the same surface that supports the wafer, thus ensuring that the beam will be perpendicular to the wafer.

The foregoing method aligns the beam in the plane of the paper, (the x-z plane, say). Another set of target members will be mounted in front of and behind the paper to provide adjustment in the y-z plane.

Figure 7:
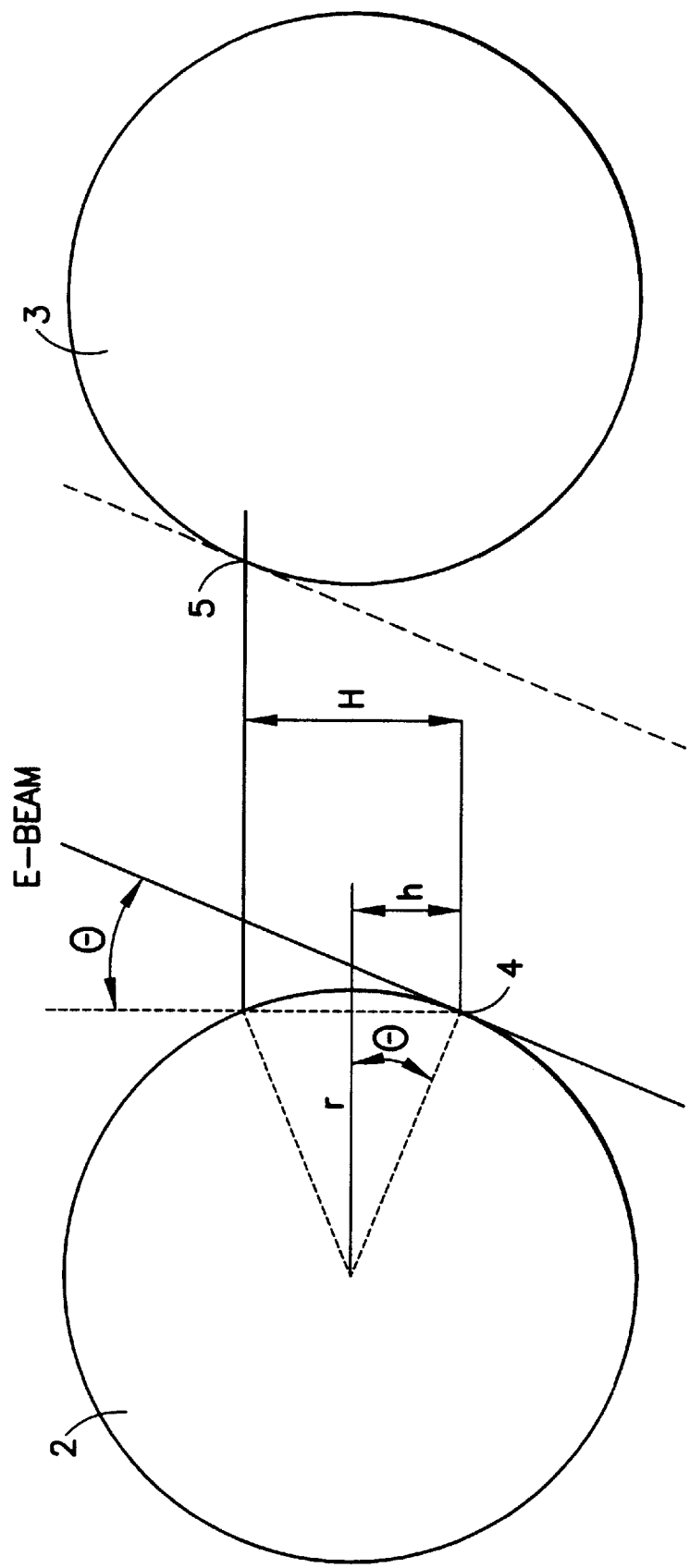
FIG. 7 illustrates the dependence of beam angle sensitivity on curvature of the beam target surface.

It is known in the art that two deflectors such as 120 and 130 (or one deflector in combination with a lens) can be adjusted to make the beam passing through appear to originate at any point—in particular, to make the beam parallel to system axis 101. Many methods of adjusting the beam direction are known in the art that can be used with the present invention. The connection between this adjustment capability and the differentiated signal from detector 30 will now be explained with reference to FIG. 7, in which a beam entering at an angle Θ with respect to the vertical grazes wire 3 at a point 5 and grazes wire 2 at a point 4, lower than point 5 by an amount H. The radius of the wires, r, is related to Θ and to H by the equation $\tan\Theta = h/r$, where H=2 h. Thus, H is a measure of the sensitivity of the method, since the beam will be defocusing away from the focal plane and a larger value for H means that the effect of the defocus will show up in the traces more easily. If the desired sensitivity in angle is to detect a deviation of 0.1 mr, and r=0.5 mm, then H=0.1 $\mu$m, which is difficult to see for lenses having a depth of focus of about 1 $\mu$m, as is typical for current systems.

If r can be increased to a much larger value, e.g. 10 mm, then H becomes 2 $\mu$m, which is much easier to observe. Unfortunately, in a practical e-beam system there is no room for a rod of diameter 20 mm. No particular value of rod diameter is required for use of the invention, since it only determines the sensitivity of the measurement. If desired, a rod need not be used as the starting material for the beam target members, but that is convenient and economical.

Figure 2:
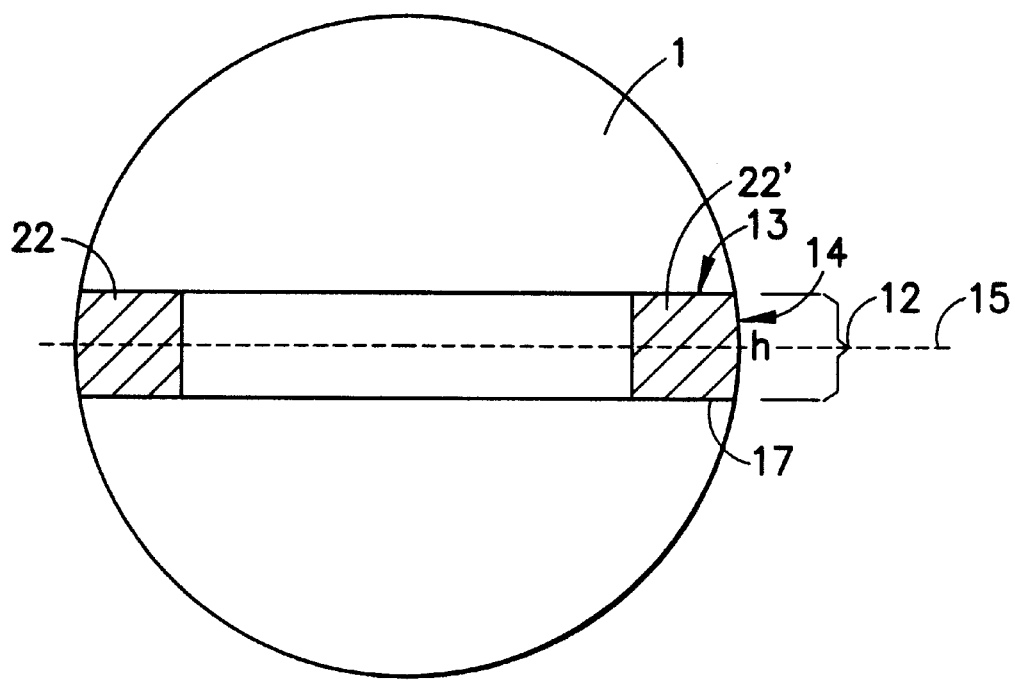
FIG. 2 illustrates a convenient method for making the required components of the system.

Referring now to FIG. 1, beam target members 22 and 22' are explained as being small portions of a 20 mm diameter rod. It has been observed that, since the tolerable angular deviation is small (about 0.5 mr) most of the rod is not needed. For example, as is shown in FIG. 2, a slice of a 20 mm diameter carbon rod of a thickness denoted by bracket 12, that is about 4 mm can be machined to have bottom support surface 17 and top surface 13 and a convex cylindrical surface 14 that is formed when the rod is formed. Typical non critical values are >5 mm for the length of surfaces 13 and 17 in the plane of the drawing and >10 mm for the distance of beam target members 22 and 22' perpendicular to the plane of the paper.

A convenient method of forming the beam target members is machining lower surface 17 in rod 1, turning the rod over and machining surface 13, then cutting out the two shapes. Alternatively, the milling tool could operate on only one side of rod 1 (the right, say) to cut a piece twice as long as the final dimension perpendicular to the paper. The piece is then cut in half. This method forms both pieces from the same side of the rod and reduces the danger that the two surfaces 14 have a different radius.

Once beam target members 22 and 22' have been cut, they can be mounted on plates 20 and 20' as shown in FIG. 1. Mechanical clamping, as by a screw passing through the target member into a threaded hole in plate 20 is preferred, in order to provide firm contact between the beam target member and the support plate and thus to establish an electrical path for electrons absorbed by the target to flow away from the beam. Preferably plates 20 and 20' are one continuous piece in order to maintain a coplanar top surface 23 for mounting beam target members 22 and the empty portion denoted by numeral 25 is an aperture in plate 20. Distance 18 in FIG. 1 is not critical and is illustratively 25 $\mu$m, though it should be greater than the diameter of the beam in order to separate the two differentiated beam profiles.

Accuracy considerations are seen with reference to FIG. 8, showing that if one side of the rod (the side forming surfaces 17) is cut with an accurately planar surface, the accuracy of other side does not affect the measurement. In FIG. 8b, the curved arrow indicates the angular range that can be measured with that very poor cut. It covers 90° and a broad range around that value. It is important, however, that the cut include a diameter of the rod. FIG. 9 illustrates a case in which the cut has not included a diameter and the resulting shapes will not permit the measurement of a 90° landing angle.

Referring again to FIG. 1, plate 20 is illustratively made of carbon and is approximately 5 mm thick. The criterion for thickness is that the plate not warp or otherwise distort, which would spoil the alignment with the workpiece. Aperture 25 is 1 mm in diameter. Target members 22 have a thickness 12 of 4 mm and a distance along surface 17 or surface 13 of 5 mm. Line 15 denotes the radius of curvature of cylindrical surface 14 and is parallel to surface 17 within 2 nm. Each of the shapes has a substantially horizontal plane, shown as plane 15 and referred to as the radial plane, that contains the radius of curvature of surface 14 and is perpendicular to the system axis, the two radial planes being coplanar within 2 nm.

The accuracy of with which the radial planes 15 are perpendicular to the beam affects a systematic error in the measurement. For example, if plane 15 is 0.5 mr from top surface 23, the aligned beam will be off by the same amount. Distance 18 is illustratively 25 $\mu$m. Processor 35 is preferably an amplifier, differentiating circuit and oscilloscope. If desired, a general purpose computer or other data processing system could be substituted for the oscilloscope, with the differentiated beam being digitized and slope of the traces being determined by counting the number of steps between zero current and full current.

While the invention has been described in terms of a single preferred embodiment, those skilled in the art will recognize that the invention can be practiced in various versions within the spirit and scope of the following claims.

We claim:

1. An apparatus for adjusting landing angle on a workpiece of a particle beam travelling along a beam direction substantially parallel to a system axis and substantially perpendicular to said workpiece, comprising:

a detector disposed to intercept said beam;

electronic means for processing beam current intercepted by said detector; and at least one pair of first and second beam target members disposed on a top surface of at least one support plate on opposite sides of said system axis, each of said beam target members having a flat support surface abutting said top surface, a cylindrical surface convex toward said system axis having a target length of said cylindrical surface, and having a radius of curvature lying in a radial plane extending along said target length and being substantially perpendicular to said system axis.

2. An apparatus according to claim 1, in which said at least one pair of beam target members comprises two pairs of beam target members disposed in first and second perpendicular planes containing said system axis.

3. An apparatus according to claim 2, in which said top surface is a top surface of a support plate having an aperture therethrough for the passage of said beam.

4. An apparatus according to claim 2, in which said top surface is formed from the top surfaces of first and second support plates, each having a plate top surface and disposed on said opposite sides of said system axis.

5. A method for adjusting a landing angle on a workpiece of a particle beam travelling along a beam direction substantially parallel to a system axis and substantially perpendicular to said workpiece, comprising:

a) sweeping said beam in a first adjustment plane across first and second beam target members disposed on a top surface of at least one support plate on opposite sides of said system axis, each of said beam target members having a flat support surface abutting said top surface, a cylindrical surface convex toward said system axis having a target length of said cylindrical surface, and having a radius of curvature lying in a radial plane extending along said target length and being substantially perpendicular to said system axis;

b) detecting said beam in a detector disposed to intercept said beam;

c) processing a signal from said detector in electronic means for processing beam current intercepted by said detector to generate first and second differentiated beam signals; and d) adjusting a focal plane of said beam until it intercepts one of said first and second beam target members, whereby a corresponding differentiated beam signal from said detector adopts a characteristic shape; and e) adjusting said beam direction until both said first and second differentiated beam signals adopt said characteristic shape.

6. A method according to claim 5, further comprising the steps of sweeping said beam in a second adjustment plane perpendicular to said first adjustment plane across third and fourth beam target members disposed on a top surface of at least one support plate on opposite sides of said system axis, each of said beam target members having a flat support surface abutting said top surface, a cylindrical surface convex toward said system axis having a target length of said cylindrical surface, and having a radius of curvature lying in a radial plane extending along said target length and being substantially perpendicular to said system axis; and repeating said steps b) through e) of claim 5.

7. A method according to claim 5, in which said step of processing a signal comprises differentiating said signal from said detector and displaying said differentiated signal on an oscilloscope.

8. A method according to claim 5, in which said step of processing a signal comprises differentiating said signal from said detector, digitizing said differentiated signal to form a digitized signal, storing said digitized signal and calculating edge slopes of said stored digitized signal.

9. A method according to claim 6, in which said step of processing a signal comprises differentiating said signal from said detector and displaying said differentiated signal on an oscilloscope.

10. A method according to claim 6, in which said step of processing a signal comprises differentiating said signal from said detector, digitizing said differentiated signal to form a digitized signal, storing said digitized signal and calculating edge slopes of said stored digitized signal.

* * * * *